United States Patent
Hong et al.

(10) Patent No.: US 6,768,380 B2
(45) Date of Patent: Jul. 27, 2004

(54) WIDEBAND, VARIABLE-BANDWIDTH DISTRIBUTED AMPLIFIER

(75) Inventors: John H. Hong, Thousand Oaks, CA (US); Jinho Jeong, Seoul (KR); Won Ko, Seoul (KR); Nyuntae Kim, Seoul (KR); Youngwoo Kwon, Seoul (KR); Kyushik Hong, Thousand Oaks, CA (US); John Hyunchul Hong, Thousand Oaks, CA (US)

(73) Assignee: Caldera Micro Technology, Inc., Oxnard, CA (US)

( * ) Notice: Subject to any disclaimer, the term of this patent is extended or adjusted under 35 U.S.C. 154(b) by 0 days.

(21) Appl. No.: 10/269,351

(22) Filed: Oct. 11, 2002

(65) Prior Publication Data

US 2004/0070455 A1 Apr. 15, 2004

(51) Int. Cl.[7] .............................. H03F 3/60; H03F 1/22
(52) U.S. Cl. ........................................ 330/286; 330/311
(58) Field of Search ................................ 330/286, 294, 330/295, 302, 308, 311

(56) References Cited

U.S. PATENT DOCUMENTS

| 4,595,881 | A | 6/1986 | Kennan |
| 6,008,694 | A | 12/1999 | El-Sharawy |
| 6,049,250 | A | 4/2000 | Kintis |
| 6,342,815 | B1 | 1/2002 | Kobayashi |
| 6,377,125 | B1 | 4/2002 | Pavio |
| 6,400,226 | B2 * | 6/2002 | Sato ........................... 330/286 |
| 6,593,810 | B2 * | 7/2003 | Yoon ...................... 330/308 X |

* cited by examiner

Primary Examiner—Steven J. Mottola
(74) Attorney, Agent, or Firm—William L. Johnson

(57) ABSTRACT

A variable bandwidth, distributed amplifier circuit includes an input transmission line; an output transmission line; and a plurality of amplifier cells having a respective plurality of cell inputs distributed along the input transmission line and cell outputs distributed along said output transmission line. Each amplifier cell comprises a cascode amplifier having an input transistor, an output transistor, and a variable impedance device in a circuit branch coupled to a gate of the output transistor. The impedance of the variable impedance device is responsive to a variable bias control signal.

13 Claims, 4 Drawing Sheets

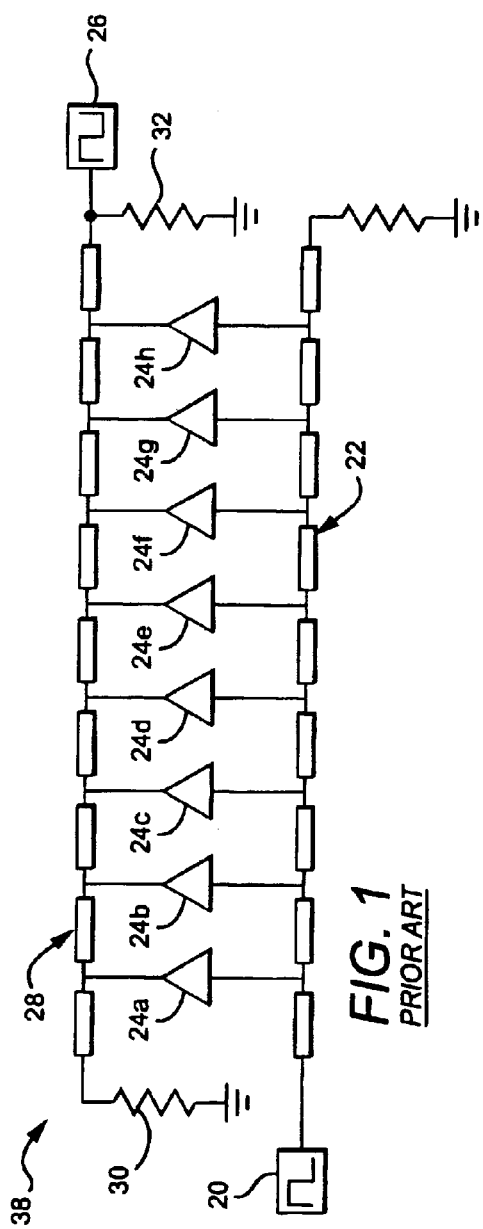
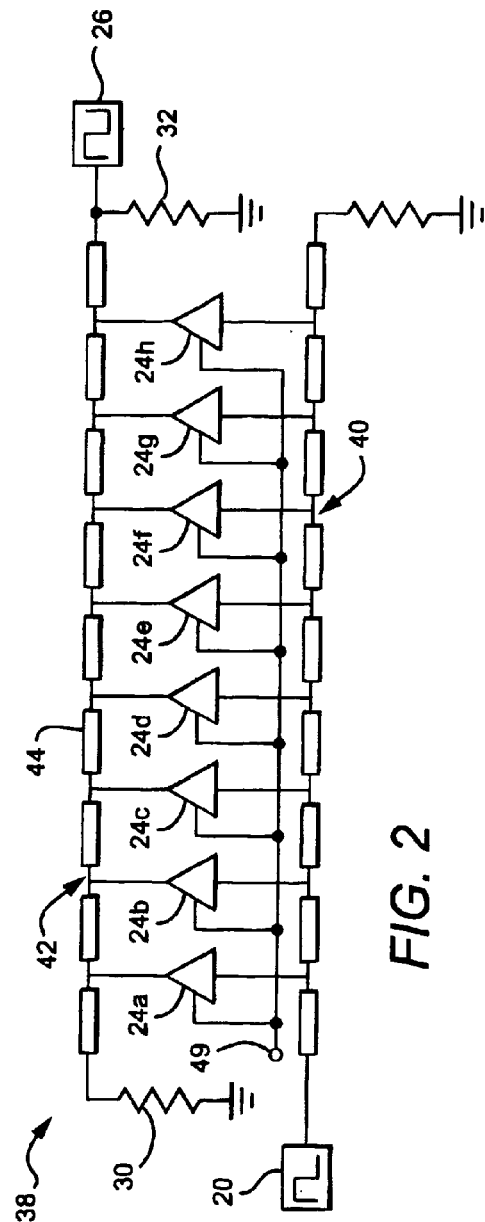
FIG. 1 PRIOR ART
FIG. 2

WIDEBAND, VARIABLE-BANDWIDTH DISTRIBUTED AMPLIFIER

BACKGROUND OF THE INVENTION

1. Field of the Invention

This invention relates to electronic amplifiers generally, and more specifically to a wideband, distributed integrated-circuit microwave amplifier suitable for use in fiber-optic and similar broadband communications applications.

2. Description of the Related Art

In broadband fiberoptics and similar communication applications, the choice of signaling waveform used can fundamentally impact the quality of the communication link. For example, in many intermediate and long reach fiber optic links, the so-called "return to zero" (RZ) binary signaling technique is used in which the signal level turns on and off within one clock cycle for a logical one and remains zero for a logical zero. The fiber optic medium and other transmission media exhibit certain waveform distortion mechanisms such as chromatic dispersion, polarization mode dispersion (PMD), and non-linear distortion, all of which severely degrade the signal to noise ratio of the communication channel (with the impairment typically increasing with distance).

The interaction of the lightwave with the fiber optic medium results in a preference for certain waveforms which are able to mitigate or even minimize pulse broadening effects. An extreme case is the "soliton" in which nonlinear interactions completely cancel pulse broadening effects of some kinds of dispersion. Even when the soliton effect is not present, the shape (or equivalently, spectral content) of the constituent pulse waveforms significantly affects both transmitter and the receiver. However, a unique and optimal pulse shaping strategy cannot be generalized for all communication environments, because links of varying lengths and characteristics demand different pulse shaping strategies. Even within the same network, various optical fibers may be encountered due to juxtaposition of newer, high performance fibers with "legacy" fibers which have not been upgraded.

A simple strategy is desired for obtaining properly shaped pulses in a programmable way to implement transmitter and receiver modules that can operate over a variety of transmission environments (e.g., links of varying lengths and therefore varying dispersion effects). To be practical, any such strategy should be capable of operation at frequencies in excess of 10 GHz (and indeed, desirably at frequencies above 50 GHz) to cope with the data rates and spectral content of current and planned optical networks.

It is known that a distributed amplifier is advantageous for handling extreme bandwidths required for data rates of 10 Gigabits per second and beyond. The distributed amplifier is also known as a traveling wave amplifier because transmission lines and propagating input and output waves are integral to the operation of the device. In a traveling wave amplifier, as shown in FIG. 1, the input signal 20 traverses a transmission line 22 periodically loaded by the inputs of amplifying unit cells 24a–24h (collectively, 24). The output signal 26 likewise traverses a transmission line 28 periodically loaded by the output ports of the amplifying unit cells 24a–24h. Each unit cell samples a portion of the input "traveling wave," amplifies it and injects the amplified output signal onto the output transmission line. The unused backward wave on the output transmission line 28 is dissipated in a matched load 30. The forward wave, which is the sum of individually amplified signals, is delivered to the load 32.

Conventional distributed amplifiers have been developed which operate in the regions above 10 GHz with exceptionally wide bandwidth. However, they are generally difficult to fabricate, tend toward instability, and have fixed bandwidth (which often varies among "identical" chips due to process variation).

SUMMARY OF THE INVENTION

In view of the above problems, an apparatus of the present invention is a distributed integrated amplifier with variable bandwidth, suitable for use at Gigahertz frequencies. The amplifier circuit includes an input transmission line; an output transmission line; a plurality of amplifier cells having a respective plurality of cell inputs distributed along the input transmission line and cell outputs distributed along said output transmission line. Each amplifier cell comprises a cascode amplifier having an input transistor, an output transistor, and a variable impedance device in a circuit branch coupled to a gate of the output transistor. The impedance of the variable impedance device is responsive to a variable bias control signal.

In its method aspect the invention includes a method of improving quality of a dispersive communication channel by varying the bandwidth of at least one of a variable bandwidth transmitter amplifier and a variable bandwidth receiver amplifier.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1 is a schematic block diagram of a prior distributed amplifier topology;

FIG. 2 is a schematic block diagram of a variable bandwidth, distributed amplifier in accordance with the invention;

DETAILED DESCRIPTION OF THE INVENTION

As shown in FIG. 2, an amplifier in accordance with the invention follows a distributed amplifier circuit (generally at 38) with input and output transmission lines 40 and 42 (respectively) coupled by a distributed series of amplifiers (generally, 44). Preferably input and output transmission lines comprise microstrip in either balanced or unbalanced configuration. Other transmission line realizations consistent with integrated circuit techniques such as the coplanar waveguide can also be used. For simplicity, an unbalanced realization is described herein, but a balanced version could be designed in accordance with the invention.

Each of the amplifiers 44 in accordance with the present invention includes a bandwidth control input 48 which is coupled to and responsive to a bandwidth control signal 49. By variation of the bandwidth control signal, the frequency response characteristics of the amplifier 38 can be varied. Thus, the amplifier 38 has a frequency response which is responsive to a variable bandwidth control signal 49.

Figure 3:
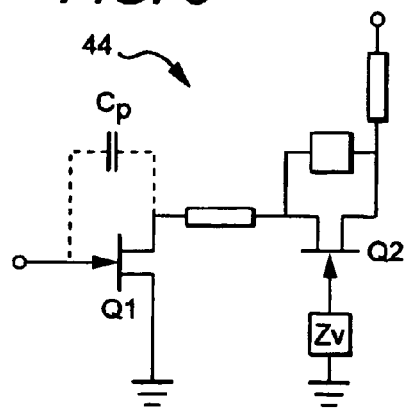
FIG. 3 is a general schematic diagram of a single amplifier cell of the distributed amplifier of FIG. 2.

Considered more specifically, in one embodiment the invention includes at least two and preferably a more numerous plurality of cascode unit cells 44, each substantially as shown in FIG. 3. Several design elements preferably cooperate to affect variable impedance loading of each unit cell. These elements include: transmission line geometry, the passive components in each unit cell, and the active device dimensions. All influence the amplifying and return loss characteristics of the circuit.

The circuit of FIG. 3 is similar to a conventional cascode amplifier circuit, wherein a first amplifier stage Q1 (a FET or bipolar transistor, for example) is arranged as a transconductance amplifier (in a common source configuration, for example). An output of the first amplification stage Q1 is coupled to a second amplification stage Q2 arranged as a transresistance amplifier (in a common gate configuration, in the example shown). The second amplification stage provides further power amplification, impedance transformation, and buffering as is known. If bipolar devices are to be used, the first and second stage would of course comprise a common emitter stage and a common base stage, respectively. The characteristics and advantages of a cascode circuit topology are well known and will not be fully enumerated here.

In accordance with the invention, a modification to each unit cell provides a programmable shunting mechanism Zv (a variable impedance circuit branch) in the feedback portion of the cascode. Thus, the modified unit cell includes at least one variable impedance active device or circuit connected in the gate or control circuit of the common gate amplifier stage (i.e., between the gate of Q2 and ground).

Figure 4:
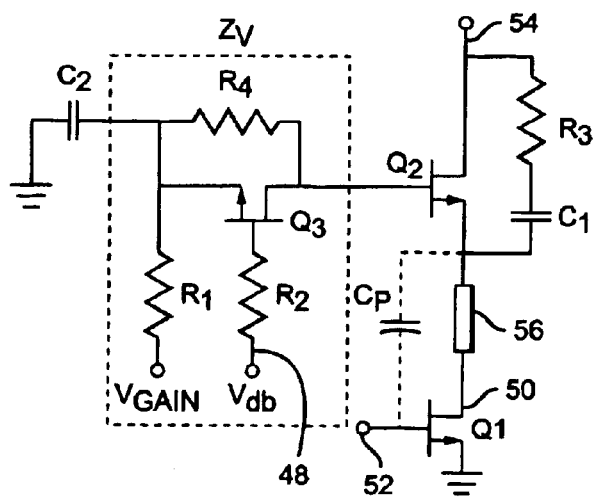
FIG. 4 is a more detailed schematic showing a particular embodiment of the amplifier of FIG. 3, showing one example of a particular variable impedance subcircuit in the circuit of FIG. 3.

In a specific embodiment shown in FIG. 4, the gate of Q2 is coupled to a fixed resistance element in parallel with a third FET Q3 which acts as a variable impedance element. The resistance between the drain and source of the parallel device Q3 can be varied across a limited range by varying the voltage on its gate.

The effect of the variable impedance between the gate of Q2 and ground can be most easily understood by comparison with the more conventional cascode circuit (which omits the variable impedance). If the gate of Q2 were grounded (for AC signals) as in a conventional cascode circuit, then the voltage at the drain of Q1 would also be effectively constrained or "pinned" at ground potential (for ac signal purposes). Pinning the drain of Q1 to ground prevents feedback via the drain-gate capacitance of Q1, which would otherwise tend to degrade the gain of the first amplifier stage (Q1) at higher frequencies. Thus, the cascode circuit extends high frequency response by nullifying the effect of drain-gate capacitive feedback, as is well known.

The present circuit differs from a conventional cascode at least in that the impedance Zv in the path from the gate of Q2 to ground causes some amplified voltage to appear at the drain of Q1 (node 50). This voltage causes negative feedback, primarily via the drain-gate capacitance (Cp) of Q1, tending to impart a low pass function to the amplification characteristic. The degree of feedback varies in response to the (variable) impedance in the gate circuit of Q2. Thus, by varying the impedance in the shunt path from the gate of Q2 to ground, one can vary the bandwidth of the modified cascode amplifier of the invention.

The parallel combination of the resistor R4 and the transistor Q3 allows the feedback impedance to vary over a range. Other resistive and/or reactive combinations can be realized in this fashion although the degree of complexity will be limited by the amount and nature of parasitics that are inherent.

More specifically, the operation of the particular embodiment of FIG. 4 can be described as follows. As the gate voltage $V_{db}$ (bandwidth control input 48) is varied on the control transistor Q3, the maximum available gain from the unit cell varies across an appreciable range, connecting an input port 50 (port 1 in standard notation) and an output port 52 (port 2 in standard notation). The parallel combination of R4 and the transistor Q3 establishes the bias between the drain and source of the control transistor Q3. If R4 is not used, the drain to source bias may become unpredictable. It is possible to impart different amplifier transfer characteristics by using generalized impedance in place of the resistor element R4 but stability issues are paramount and must be incorporated in any such design procedure. Nevertheless, the invention encompasses substitution of a generalized impedance for R4 (and indeed, the characteristics of real components are such that a complex impedance will generally be implied in any realization of R4).

Vgain sets the bias point of Q2 and thus affects the gain of Q2 and overall cell gain. Impedances R1 and R2 are used to set suitably high input impedances for the two voltages $V_{gain}$ and $V_{db}$. The combination of R3 and C1 provide a high frequency attenuation so as to prevent unwanted oscillations common to cascode designs. A transmission line 56 connects the unit cell's first amplifier stage (the drain of Q1) to the unit cell's second amplifier stage (source of Q2) in such a way as to match the impedances of the two at the high frequency end so as to flatten the response across frequency. The design values and transmission line dimensions must be carefully computed as they are strongly dependent on the particular transistor sizes that are used.

For example, in a particular embodiment of the circuit, when using a 0.15 um gate length GaAs (gallium arsenide) PHEMT (pseudomorphic high electron mobility transistor) transistor consisting of 2 gate fingers with each gate finger width being 40 um, we have determined the following design parameters computed with computer aided design software. R1, R2, and R3 are suitably each about 300 ohms in value. The transmission line 56 is suitably 150–170 um in length and has a characteristic impedance of 70–80 ohms. C1 and C2 are 1 pF each. R4 can take on values in the range 200–300 ohms.

Although this specific example uses a particular compound semiconductor transistor technology (GaAs PHEMT), this invention is not tied to any particular technology. The circuit can be used effectively in silicon bipolar, silicon germanium heterojunction bipolar, indium phosphide heterojunction bipolar, or other transistor processes, albeit with differing performance elements due to the inherent performance tradeoffs associated with each technology.

Figure 5:
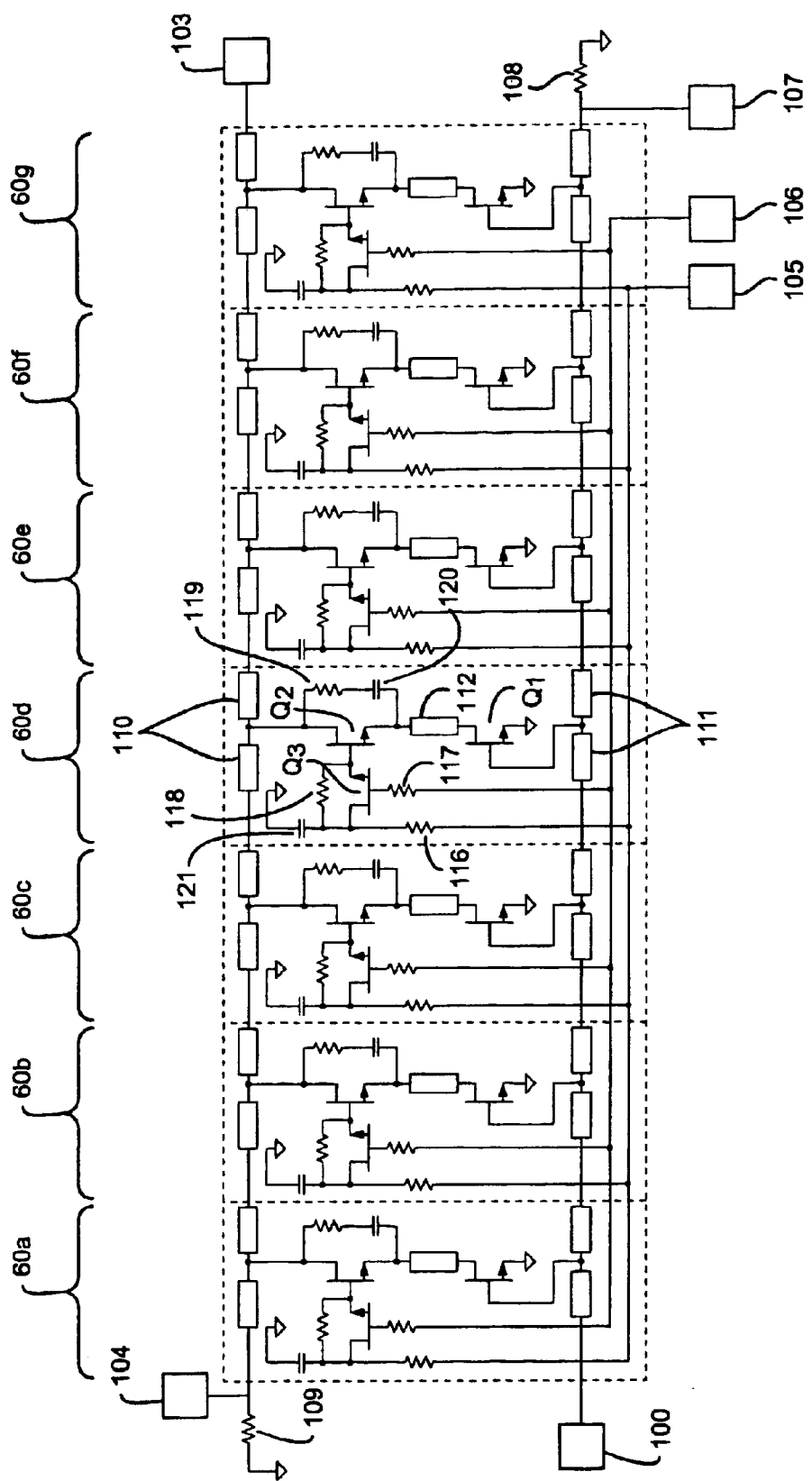
FIG. 5 is a schematic circuit diagram of a multistage, distributed amplifier in the form of FIG. 2, showing suitable circuits and components in detail.

A specific embodiment of a complete, multistage distributed amplifier in accordance with the invention is shown in FIG. 5. Seven unit cells 60a–60g couple between an input port 101 and an output port 103. A drain bias port 104 provides drain bias to the cascode unit cells 60a–60g. A unit cell gain voltage is applied at 105 to set the gain of each unit cell. A bandwidth control voltage (corresponding to 49 in FIG. 2) is applied at 106 to vary the bandwidth of the amplifier. This bandwidth control voltage is suitably connected in parallel to each stage and controls the reactance of the unit cells by the method described above in connection with the unit cell. Another D.C. bias, denoted "input gate control voltage" should be supplied at 107 to control the waveform symmetry of the amplifier.

Individual component values given herein are by way of example and not as limitations. Typical values are given here for one unit cell; unless otherwise noted, all cells 60a–60g can use substantially identical component values. Resistors 108 and 109 are input and output transmission line terminations, respectively. These resistors are suitably set to 50 ohms to match a 50 ohm microstrip transmission line. Transmission line 110 is suitably a microstrip transmission line comprising 100 micron of dielectric thickness, fabricated in Gallium arsenide, with a 15 micron strip width and a 360 micron length. Transmission lines 111 and 112 have the same composition, length and thickness as 110, but with a 320 micron length. Transistors Q1 and Q2 are suitably PHEMT transistors with a 0.15 micron gate length and 80 micron gate width. Q3 is suitably a PHEMT transistor with 0.15 micron gate length and 70 micron gate width. Resistors 116 and 117 are each suitably 500 ohms; Resistors 118 and 119 are each suitably 250 ohms. Finally, capacitors 120 and 121 are suitably each 0.3 picofarad.

While the specific embodiment of FIG. 5 employs substantially similar stages with bias control inputs connected in parallel, it is also possible within the scope of the invention to use non-identical or dissimilar stages (unit cells) with differing or even independent bias controls. The transfer characteristics of such variations would depend in a complex manner on the gain controls and the transmission line geometry, however.

Figure 6:
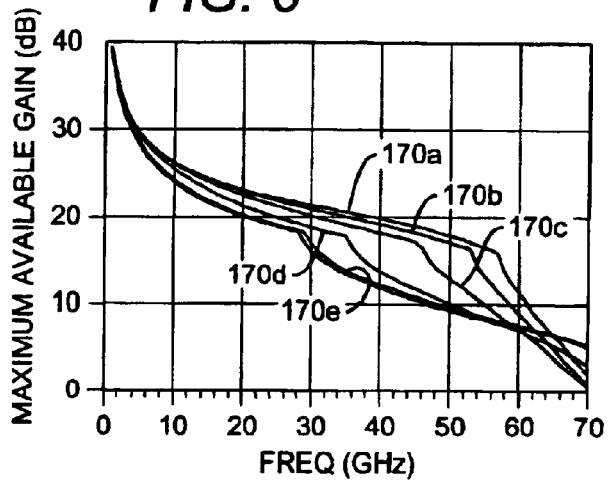
FIG. 6 is a graph of maximum available gain (in decibels) as a function of frequency (in Gigahertz) for a unit cell circuit of FIG. 4, showing several function curves, each corresponding to a different bandwidth control input level.

The range of gain and the bandwidth character of each unit cell (for example, 60a) is shown in FIG. 6. These plots were generated with measured transistor data from a GaAs PHEMT 0.15 um gate geometry transistor set (each with 2×40 um geometry). The output Gain versus frequency plots 170a–170f are associated with respective different bias inputs at 106 in FIG. 5 (bandwidth control signals 49 in FIG. 3) as shown in TABLE 1, below. VGF in both Tables 1 and 2 refers to the voltage between the gate and source of Q3.

TABLE 1

| Curve | Voltage (VGF) |
| --- | --- |
| 170a | −0.5 volts |
| 170b | −0.7 v |
| 170c | −0.9 v |
| 170d | −1.1 v |
| 170e | −1.3 v |

Figure 7:
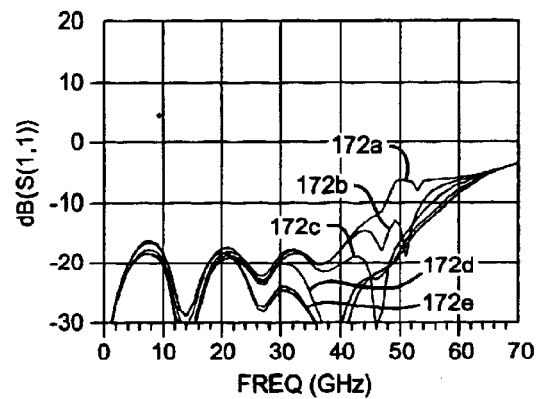
FIG. 7 is a graph of scattering parameter S(1,1) (in decibels) as a function of frequency (in Gigahertz) for the circuit of FIG. 5, showing several function curves, each corresponding to a different bandwidth control input level.
Figure 8:
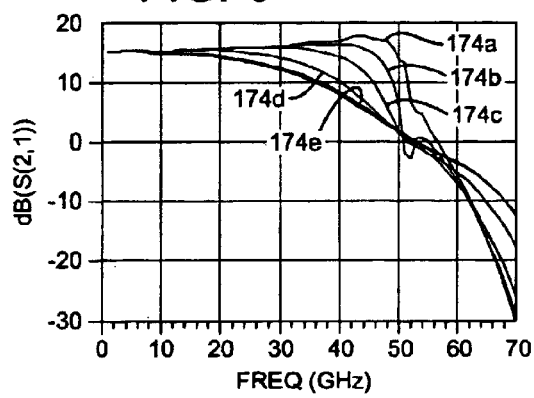
FIG. 8 is a graph of scattering parameter S(2,1) (in decibels) as a function of frequency (in Gigahertz) for the circuit of FIG. 5, showing several function curves, each corresponding to a different bandwidth control input level.
Figure 9:
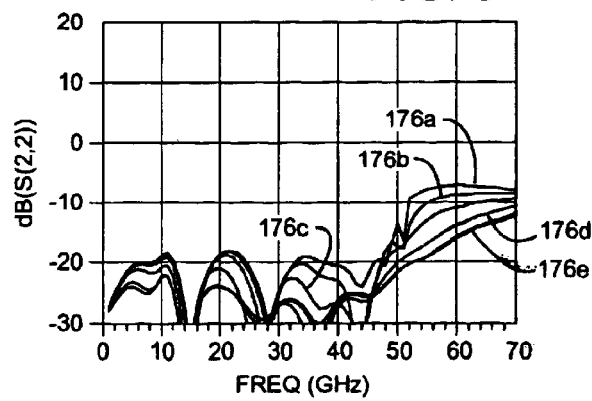
FIG. 9 a graph of scattering parameter S(2,2) (in decibels) as a function of frequency (in Gigahertz) for the circuit of FIG. 5, showing several function curves, each corresponding to a different bandwidth control input level.

The overall gain S(2,1) from input to output ports of the distributed amplifier of FIG. 5 is shown as curves 172a–172e in FIG. 7. Similarly, S(2,1) and S(2,2) are graphed respectively as 174a–174e and 176a–176e in FIGS. 8 and 9. Conventional scattering parameter notations are used. The multiple characteristic curves (for each parameter) again correspond to different respective input bias signals at 106 (bandwidth control signals 49 in FIG. 3) as given in TABLE 2 below. The conditions associated with the differing curves a–e are again tabulated in Table 2, below.

TABLE 2

| Curves (172, 174, 176) | Voltage (VGF) |
| --- | --- |
| a | −0.5 volts |
| b | −0.7 v |
| c | −0.9 v |
| d | −1.1 v |
| e | −1.3 v |

The responses in FIGS. 6–9 were obtained with VGC (at 105)=1.5 volt, VG (at 107)=−0.5 volt, and VD (at 104)=5 volt.

Several salient characteristics are apparent from FIGS. 6–9. First, variation of the bias signal (bandwidth control signal 49 in FIG. 3) produces a variation in the gain or S(2,1) in response to the bias signal. The other parameters S(1,1) and S(2,2) are also affected in a complex manner. The gain S(2,1) is variable, in the embodiment illustrated, between a 3 db bandwidth of 20 GHz and a 3 db bandwidth of as high as 50 GHZ. At all gain settings the gain characteristic rolls off relatively smoothly and is substantially flat across the passband region of the frequency response curve. It is also noteworthy that the gain is relatively constant below the "knee" (3 db point) for all bias inputs. Differently stated, varying the bias input produces substantially constant gain vs frequency below a critical frequency. Another important characteristic is the extended low frequency response, which extends substantially down to D.C. (direct current or 0 Hz.). Adequate response at low frequencies is advantageous in many optical modulation strategies, which may produce substantial low frequency content (which depends on the channel coding strategy employed).

One additional advantage of the circuit of the invention is that it can be adjusted easily, by varying the bias control input, to accommodate variations in the integrated circuit fabrication process. In other words, manufactured apparently identical MMICs may vary in their gain and frequency response characteristics due to process variation. The MMIC of the invention can be easily adjusted to a desired bandwidth by setting the bias control.

Figure 10:
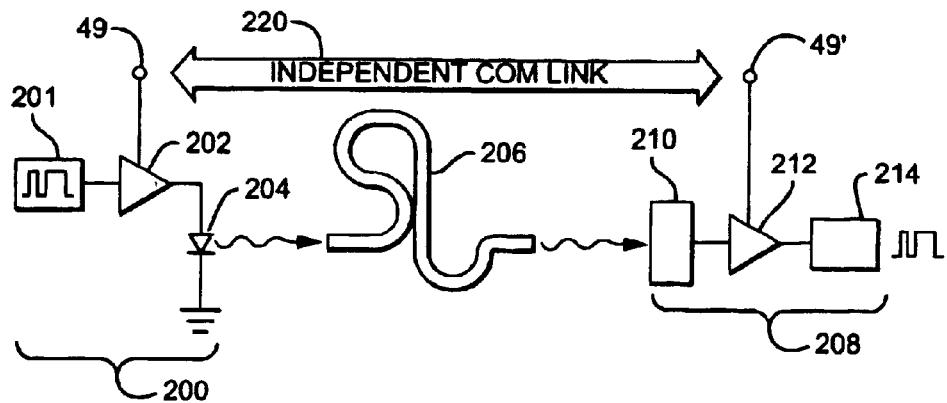
FIG. 10 shows an optical network environment incorporating the variable bandwidth amplifier of the invention.

The circuit of the invention is useful, for example and not by way of limitation, in a fiber optic communication network. A simplified fiber optic communication network is illustrated in FIG. 10. A transmitter 200 includes an data source 201 and an electronic amplifier 202 which drivers an electroptic, modulatable light source such as a laser diode 204. The emitted, modulated light travels through a fiber optic medium 206 to a receiver 208, where it is detected by a photodetector 210 (such as a photodiode) and converted to an electronic signal. The electronic signal is then amplified by a receiver amplifier 212, then detected and decoded by a receiver module 214 to recover the data. Although a half-duplex or one way communication link is illustrated, full-duplex and various types of multiplexed communication links are also well known and suitable for the apparatus and method of the invention.

In accordance with a method using the circuit of the invention, at least one of the transmitter and receiver amplifiers comprise a variable bandwidth amplifier according to the invention, as described above in connection with FIGS. 2–9. Thus, at least one of the amplifiers 202 and 212 have a bandwidth control input 49 (or 49' at the receiver amplifier).

The advantage gained by including a variable bandwidth amplifier can be explained as follows. The control of bandwidth for both receive and transmit portions of the fiber optic link can be an important element in combating the effects of dispersion and noise. In a receiver, the total noise present in the received waveform is proportional to the total bandwidth the receiver allows to pass through its system. On the other hand, the ability to accurately receive a data signal is proportional to the bandwidth since faster signal response stemming from higher bandwidth will decrease the rise and fall times proportionally. These opposing consideration lead to an optimum setting for the bandwidth which may, in some cases, be determined using statistical decision theory. Alternatively, one can measure a parameter of merit (such as signal to noise or bit error rate) while varying the receiver amplifier bandwidth to improve or optimize the parameter. It is thus useful to control the amplifier bandwidth in a way that is dependent on the type of noise present.

The control of bandwidth for transmit is important for another reason. Higher bandwidth for the transmit waveform means faster rising and falling edges. In a dispersive communication channel, however, these higher bandwidth waveforms are subject to larger dispersion penalties since the amount of pulse spreading is an increasing function of bandwidth. Although a much better pulse shape can be measured at the transmit node with higher bandwidth, the spreading influence of dispersion demands that a lower but optimum bandwidth setting is required to minimize the total dispersion penalty in the fiber optic link.

Therefore, one method of improving the quality of a given optical communication channel is to determine a received signal parameter of merit (such as signal to noise or bit error rate) while varying the bandwidth of a transmitter amplifier to improve the parameter of merit. To adjust the transmitter amplifier bandwidth, information representing the received signal or the dynamic state of the parameter of merit is fed back to the transmit node via an independent communication link 220; the transmit bandwidth is then adjusted in response to the fed back information (either manually or automatically via a control system). Similarly, to adjust the receiver bandwidth, data can be fed forward via the independent communication link 220 and compared with received data. The receive bandwidth is then adjusted to achieve a desired performance level. The test information transmitted could suitably be a previously known benchmark signal or signals, in which case the independent communication link 220 need not have wide bandwidth, or could even be eliminated entirely.

In most cases empirical testing will be required because of the complex relationships between dispersion, nonlinear optical effects, and noise. But in any link the ability to easily vary the bandwidth of the transmitter amplifier should facilitate improvement (and often, optimization) of the link quality.

Adjustment of the variable bandwidth could also be performed to compensate for variables other than the characteristics of the optical fiber link. For example, the circuit of the invention can easily and accurately be adjusted to a desired bandwidth regardless of process variations in manufacture. The ability to accurately set the bandwidth of a broadband microwave amplifier can greatly simplify design of multistage microwave systems, and can facilitate design for stability in the presence of process variations.

While several illustrative embodiments of the invention have been shown and described, numerous variations and alternate embodiments will occur to those skilled in the art. For example, bipolar, FET, or other amplification devices could be employed in the circuit. Such variations and alternate embodiments are contemplated, and can be made without departing from the spirit and scope of the invention as defined in the appended claims.

We claim:

1. A distributed integrated amplifier circuit, suitable for use at gigahertz frequencies, comprising: an input transmission line;
   an output transmission line; and
   a plurality of amplifier cells having a respective plurality of cell inputs distributed along said input transmission line and cell outputs distributed along said output transmission line, each amplifier cell comprising:
   a first amplifier stage, having an input coupled to a respective one of said cell inputs and producing a first amplified signal at a first stage output;
   a second amplifier stage arranged to receive said first amplified signal at a second stage input and having an input impedance which is variable in response to an bandwidth control signal input, said second amplifier stage also having an output coupled to a respective one of said cell outputs;
   said cell having a frequency response characteristic which varies in response to said bandwidth control signal input.

2. The amplifier circuit of claim 1 wherein said first and said second amplifier stages comprise respective first and second FET amplifiers connected in a cascode configuration.

3. The amplifier circuit of claim 2 wherein said FETs comprise pseudomorphic high electron mobility transistors (PHEMTs).

4. The amplifier circuit of claim 2 wherein said input impedance of said second amplifier stage includes a variable impedance active device, and said bandwidth control signal input affects an impedance of said variable impedance active device.

5. The amplifier circuit of claim 4 wherein said variable impedance active device is an FET.

6. The amplifier circuit of claim 1 wherein said input transmission line and said output transmission line are monolithically integrated with said amplifier cells.

7. The amplifier circuit of claim 6 wherein at least one of said amplifier cells includes a gallium arsenide device.

8. A distributed integrated amplifier with variable bandwidth, suitable for use at Gigahertz frequencies, comprising:
   an input transmission line;
   an output transmission line;
   a plurality of amplifier cells having a respective plurality of cell inputs distributed along said input transmission line and cell outputs distributed along said output transmission line;
   wherein each amplifier cell comprises a cascade amplifier having an input transistor, an output transistor, and a variable impedance device in a circuit branch coupled to a gate of said output transistor;
   and wherein the impedance of said variable impedance device is responsive to a variable bias control signal.

9. The amplifier of claim 8, wherein said variable impedance device comprises an FET.

10. The amplifier of claim 8 wherein said input transistor and said output transistor of said cascade amplifier comprise PHEMT field effect transistors.

11. The amplifier of claim 8 wherein said input transistor and said output transistor of said cascade amplifier comprise bipolar transistors.

12. The amplifier of claim 8, wherein said input transistors have an inherent capacitive coupling from a drain of said input transistor to a gate of said input transistor;

and wherein said variable impedance device is arranged to couple feedback around said input transistor via said inherent capacitive coupling, with the relative magnitude of said feedback varying in relation to the impedance of said variable impedance device, thereby varying the bandwidth response of the amplifier.

13. A method of improving the quality of a fiber optic communication channel having dispersive characteristics, said communication channel having an electronic transmitter amplifier which causes modulation of a transmit light source and an electronic receiver amplifier which amplifies received light, the method comprising performing the acts of:

measuring a parameter of the communication channel; and electronically varying the bandwidth of at least one of said receiver amplifier and said transmitter amplifier in response to said measured parameter, to improve said parameter;

wherein said at least one of said receiver and said transmitter amplifier comprises:

an input transmission line;

an output transmission line;

a plurality of amplifier cells having a respective plurality of cell inputs distributed along said input transmission line and cell outputs distributed along said output transmission line;

wherein each amplifier cell comprises a cascade amplifier having an input transistor, and an output transistor, and a variable impedance device in a circuit branch coupled to a gate of said output transistor;

and wherein the impedance of said variable impedance device is responsive to a variable bias control signal.

* * * * *